(12) United States Patent
Garimella et al.

(10) Patent No.: US 8,700,360 B2
(45) Date of Patent: Apr. 15, 2014

(54) SYSTEM AND METHOD FOR MONITORING AND DETECTING FAULTS IN A CLOSED-LOOP SYSTEM

(75) Inventors: Phanindra Garimella, Bloomington, IN (US); Howard Bishop, Columbus, IN (US)

(73) Assignee: Cummins Intellectual Properties, Inc., Minneapolis, MN (US)

( * ) Notice: Subject to any disclaimer, the term of this patent is extended or adjusted under 35 U.S.C. 154(b) by 205 days.

(21) Appl. No.: 12/983,260

(22) Filed: Dec. 31, 2010

(65) Prior Publication Data

US 2012/0167665 A1    Jul. 5, 2012

(51) Int. Cl.
*G01R 23/165* (2006.01)
*G01M 15/10* (2006.01)
*G05B 23/02* (2006.01)

(52) U.S. Cl.
CPC ........ *G05B 23/0221* (2013.01); *G05B 23/0205* (2013.01); *G05B 23/0218* (2013.01); *G01M 15/10* (2013.01); *G01R 23/165* (2013.01); *F01N 2900/0408* (2013.01); *F01N 2900/0418* (2013.01)
USPC ......... 702/190; 701/29.1; 701/33.7; 701/102; 701/103; 701/108

(58) Field of Classification Search
CPC ...... G01R 23/16; G01R 23/165; G05B 23/00; G05B 23/02; G05B 23/0205; G05B 23/0218; G05B 23/0221; G05B 23/0237; G01M 15/10; F01N 2900/0408; F01N 2900/04; F01N 2900/0404; F01N 29/0418; F01N 2550/00
USPC ......... 702/190; 701/29.1, 33.7, 102, 103, 108
See application file for complete search history.

(56) References Cited

U.S. PATENT DOCUMENTS

| | | | |
|---|---|---|---|
| 4,424,709 A * | 1/1984 | Meier et al. | 73/114.25 |
| 5,190,017 A | 3/1993 | Cullen et al. | |
| 5,394,744 A * | 3/1995 | James et al. | 73/114.02 |
| 5,585,552 A | 12/1996 | Heuston et al. | |
| 5,675,080 A * | 10/1997 | Wada | 73/114.74 |
| 5,678,521 A | 10/1997 | Thompson et al. | |
| 6,085,732 A * | 7/2000 | Wang et al. | 123/568.12 |
| 6,553,816 B1 | 4/2003 | Palanisamy et al. | |

(Continued)

OTHER PUBLICATIONS

Rhinehart, R. Russell, "A CUSUM type on-line filter", Process Control and Quality, 1992, pp. 169-176, vol. 2.*

(Continued)

*Primary Examiner* — Mohamed Charioui
*Assistant Examiner* — John Kuan
(74) *Attorney, Agent, or Firm* — Foley & Lardner LLP

(57) ABSTRACT

A closed-loop system having a controllable variable is monitored to detect the off-nominal behavior and raise an alert when fault is detected. The faults show up in such a way that the tracking error signal is impacted and this impact manifests itself as a change in the frequency components. A filter isolates a band of frequency components of the tracking error signal that are more impacted than others by deviation caused by a fault to be detected. The filter can effectively amplify the section of the error tracking signal that contains the frequency components having impact. In addition, the filter will also have the characteristics to attenuate the impact of other frequency components. An accumulated error signal is generated from the filtered tracking error signal, compared with a predetermined fault threshold characteristic, and a fault alert is provided if a predetermined threshold is satisfied.

20 Claims, 8 Drawing Sheets

(56) References Cited

U.S. PATENT DOCUMENTS

| | | |
|---|---|---|
| 7,096,861 B1 | 8/2006 | Tsuda et al. |
| 7,460,958 B2 | 12/2008 | Walsh et al. |
| 2002/0129799 A1 | 9/2002 | Wang et al. |
| 2004/0206074 A1 | 10/2004 | Akao et al. |
| 2005/0045139 A1* | 3/2005 | Fagala ............ 123/184.56 |
| 2007/0000247 A1* | 1/2007 | Perkins ............ 60/565 |
| 2007/0034745 A1* | 2/2007 | Fackler et al. ........ 244/158.2 |
| 2008/0027585 A1* | 1/2008 | Wesquet et al. ......... 700/283 |
| 2009/0268791 A1* | 10/2009 | Waheed et al. ......... 375/219 |

OTHER PUBLICATIONS

Douglas M. Hawkins et al., "Cumulative Sum Charts and Charting for Quality Improvement," Springer-Verlag, New York, Inc., 1998, Statistics for Engineering and Physical Science, Series Editors P. Green et al., 263 pages.

The International Search Report and the Written Opinion of the International Searching Authority with mailing date of Jul. 25, 2012; International Application No. PCT/US2011/067834.

* cited by examiner

SYSTEM AND METHOD FOR MONITORING AND DETECTING FAULTS IN A CLOSED-LOOP SYSTEM

FIELD OF THE INVENTION

The invention relates to monitoring a closed-loop system, such as an exhaust gas recirculation (EGR) system, having a controlled variable, and in particular, to a system and method for monitoring a closed-loop system for variation in performance and system fault detection based on the closed-loop system performance variation.

BACKGROUND

Since the 1970's, government legislation has required increasing reductions of NOx in exhaust gas emissions. To comply with increasingly stringent government mandates, industry has developed several EGR (Exhaust Gas Recirculation) systems, which re-circulate the exhaust gas to reduce the $NO_x$ gas emissions. At the same time, government regulations are requiring on-board diagnostics (OBD) on heavy duty gasoline and diesel engines to monitor the functioning of emission control components and alert the vehicle operator to any detected need for emission-related repair.

Emissions targets for 2010 and beyond require the use of extreme high fidelity EGR flow measurement to control NOx during engine transients, as well as to provide precise measurement of EGR flow resulting from exhaust manifold pulsations. In modern Diesel engines, the air-handling system is tightly controlled so as to obtain the commanded amount of EGR which is determined by the combustion recipe. The presence of a fault in the EGR handling system (e.g., a restriction, a leak or a faulty sensor/actuator) would lead to the wrong amount of EGR being delivered at the wrong amount of time. This leads to an emission exceedance of either $NO_x$ or particulate matter (PM).

In addition to an EGR system, emissions requirements are requiring increasing performance from other internal combustion engine subsystems. For example, three major closed-loop control systems in modern diesel engines involve controls for the air-handling system that control and regulate the amount of fresh air-flow and EGR flow that is sent into the engine's cylinder, controls for the fuel system that controls the timing and the amount of fuel that is injected into the cylinder, and controls the exhaust aftertreatment system, such as a SCR system.

SUMMARY

The inventions are directed to a system, method and internal combustion engine system that monitors a closed-loop system having a controllable variable to detect the off-nominal behavior of the system and raising an alarm or other alerting mechanism when fault is detected.

In an embodiment consistent with the claimed invention, a method of detecting fault in a closed-loop system includes monitoring a tracking error signal indicative of a difference between a reference value of a variable of the closed-loop system to be controlled and a measured value of the variable being controlled, filtering the tracking error signal to isolate a band of frequency components impacted by deviation in the tracking error signal caused by a fault to be detected, and generating an accumulated error signal from the filtered tracking error signal. The accumulated error signal is compared with a predetermined fault threshold characteristic, and if the accumulated error signal meets the predetermined threshold an indicator of fault is provided for the closed-loop system.

In another embodiment consistent with the claimed invention, a system is provided for monitoring a tracking error signal indicative of a difference between a reference value of a variable of the closed-loop system to be controlled and a measured value of the variable being controlled and detecting faults in a closed-loop system. The system includes a first filter module adapted to receive the tracking error signal and filter the tracking error signal to isolate a band of frequency components impacted by deviation in the tracking error signal caused by a fault to be detected. A second filter module is communicatively coupled with the first filter module and is adapted to receive the filtered tracking error signal and generate an accumulated error signal from the filtered tracking error signal. A fault processing module is communicatively coupled with the second filter module and is adapted to receive the accumulated error signal and compare the accumulated error signal with a stored predetermined fault threshold characteristic and provide an indicator of a fault in the closed-loop system if the accumulated error signal meets the predetermined fault threshold characteristic.

In yet another embodiment consistent with a claimed invention, an internal combustion engine system including an engine, an intake manifold connected to the engine, an intake body fluidly connected to the intake manifold and including a chamber through which charge air flows, an exhaust manifold connected to the engine, and an exhaust gas recirculation (EGR) passage fluidly connected at one end thereof to the exhaust manifold and at another end thereof to the chamber of the intake body. In the EGR passage, exhaust gas flow is controlled by an EGR closed-loop system as a function of an exhaust flow tracking error signal, and the engine system includes a monitor for detecting faults in the EGR closed-loop system. The monitor includes a first filter element that receives the exhaust tracking error signal and filters the tracking error signal to isolate a band of frequency components impacted by deviation in the error signal caused by a fault to be detected and provide a filtered tracking error signal having the isolated frequency band. A second filter element is communicatively coupled with the first filter element and adapted to receive the filtered tracking error signal and generate an accumulated error signal from the filtered tracking error signal. A fault processing element is communicatively coupled with the second filter element and adapted to receive the accumulated error signal, compare the accumulated error signal with a stored predetermined fault threshold characteristic, and provide an indicator of fault in the closed-loop system if the accumulated error signal meets the predetermined threshold.

Other features, elements, characteristics and advantages of the present invention will become more apparent from the following detailed description of exemplary embodiments of the present invention with reference to the attached drawings.

DETAILED DESCRIPTION

Figure 1:
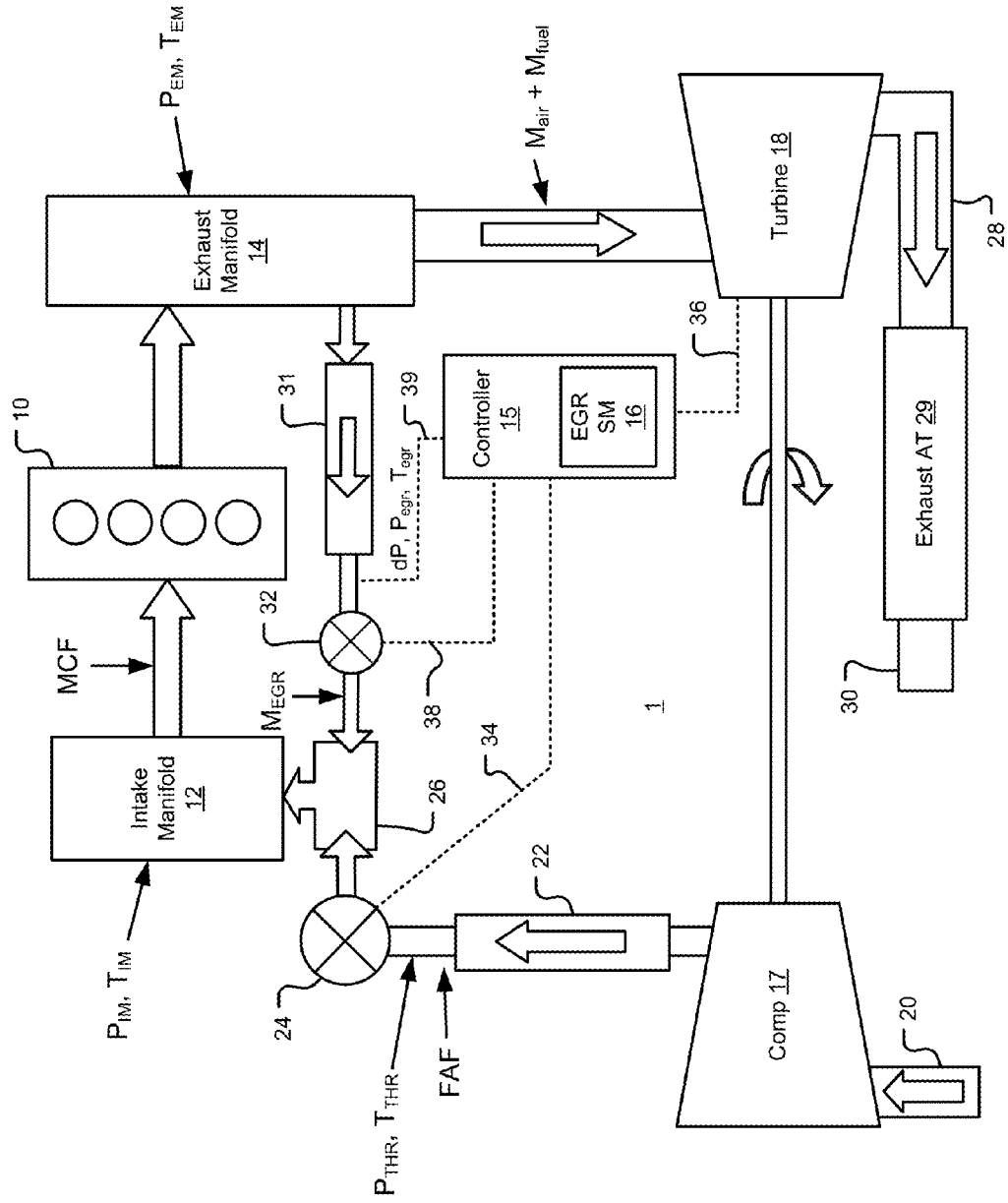
FIG. 1 is a diagram of an internal combustion engine system including a closed-loop EGR control system and EGR system monitoring system according to an exemplary embodiment.

FIG. 1 is a diagram of an internal combustion engine system 1 that includes an EGR system monitor according to an exemplary embodiment. As shown in FIG. 1, the internal combustion engine system 1 includes a first fluid communication path between an intake manifold 12 and an exhaust manifold 14 through an internal combustion engine 10; and a second fluid communication path included in an EGR loop between the intake manifold 12 and the exhaust manifold 14. A controller 15 controlling and monitoring various elements of engine system 1 and includes an EGR system monitor (SM) 16. The controller 15 will be described later in greater detail.

Fresh air is provided to the intake manifold 12. A compressor 17, which is mechanically driven by a turbine 18 fluidly connected to the exhaust manifold 14, receives the fresh air at ambient temperature and pressure from a fresh air inlet 20, compresses that air, and the compressed fresh air mass flow rate (FAF) flows to a charge air cooler (CAC) 22 provided downstream of the compressor 17. An intake throttle 24 is positioned downstream of the CAC 22 and is operable to control the flow of fresh air via an actuator (not shown) that is controlled by the controller 15 via signal path 34. The intake manifold 12 is connected to an intake body including a chamber, or mixer 26 that is fluidly coupled between the intake throttle 24 and the intake manifold 12 to mix air from the compressor 17 and EGR gas to provide charge air to the intake manifold 12. Fuel is injected into either the intake manifold or directly into the cylinders of the engine 10, where it is combusted with the charge air. The exhaust manifold 14 is fluidly connected to the cylinders to received exhaust gas produced during combustion of charge air and fuel in the cylinder. The turbine 18 is fluidly connected downstream of the exhaust manifold 14 and the exhaust gas mass flow ($M_{air}+M_{fuel}$) at pressure PEM and temperature TEM enters the turbine 18.

The turbine 18 includes an actuator (not shown) that is operable to alter its efficiency or operational range under the control of the controller 15 via signal path 36. For example, the turbine 18 can be a VGT (variable geometry turbocharger), which allows altering the orientation of vanes in the turbine based on a position of an actuator (e.g., an electric, pneumatic and/or hydraulic actuator) to supply sufficient boost at all engine speeds and ensure a specified ratio of EGR gas recirculated back to the engine intake manifold 12. The exhaust gas exiting the turbine 18 enters conduit 28 and is provided to an exhaust after-treatment (AT) system 29 before exiting through an exhaust pipe 30 to the ambient environment. Alternatively, the turbine 18 can be a multi-staged turbocharger (e.g., a high pressure turbine fluidly connected to a low pressure turbine) operating in series or sequential mode.

The EGR loop starts at the exhaust manifold 14 where exhaust gas enters a passage that can include an EGR cooler 31 and EGR control valve 32. The EGR control valve 32 is operable to control how much and when exhaust gas mass flow MEGR flows into the mixer 26 where it is mixed with compressed air supplied by the compressor 17. The EGR control valve 32 is controlled to provide an MEGR value corresponding to an EGR mass flow command based on an operating mode or condition. The EGR control valve 32 is generally partially closed or closed at idle, high, and low operating speeds. The position of the EGR valve 32 is controlled by the controller 15 via a signal along signal path 38.

In an embodiment, the controller 15 can be an electronic control unit (ECU) or electronic control module (ECM), or one or more controllers separate from, but in communication with an ECU/ECM. The controller 15 can include a processor and modules in the form of software or routines that are stored on computer readable media such as memory (not shown), which are executable by the processor of the control module. In alternative embodiments, modules of control module 15 can include electronic circuits for performing some or all or part of the processing, including analog and/or digital circuitry. The modules can comprise a combination of software, electronic circuits and microprocessor based components. The controller 15 can receive data regarding requested power, data indicative of engine performance, exhaust gas composition including, but not limited to engine position sensor data; engine speed sensor data (rpm); vehicle speed data (mph), exhaust mass flow sensor data, fuel rate data, intake manifold pressure (IMP) data, EGR pressure ($P_{egr}$), and other pressure sensor data; intake manifold temperature (IMT) data, EGR gas temperature ($T_{egr}$) data, and other temperature sensor data from locations throughout the engine 10; data from various parts of the exhaust after-treatment system 29 (e.g., pressures and temperatures of DPF, SCR, DOC and/or other AT elements), and other data. The controller 15 can then generate control signals and output these signals to control the fuel injectors of a high pressure fuel system (not shown) to inject a metered amount of fuel either directly into the engine cylinders or indirectly (e.g., into the intake manifold 12) to operate within either a lean burn condition or a stoichiometric condition, depending on the engine load or other conditions. For example, the controller 15 can determine an air flow command ($M_{FAF\_}$cmd), charge flow command (MCF_cmd), fueling amount, injection timing etc. in response to a requested engine speed and load, and set various actuator devices in the engine system including the actuators of the engine system 1 to achieve the requested speed and load. In the case of an ECU/ECM, the vehicle or system OBD (e.g., OBD-II or HD-OBD) can include an interface (not shown) that can access the ECU/ECM to obtain the status of the EGR system and numerous other data for monitoring and detecting emissions related issues.

Figure 2:
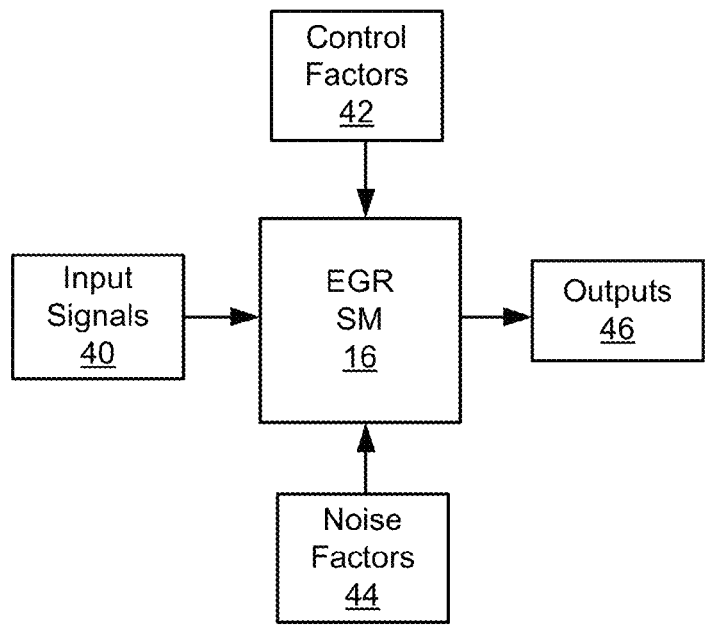
FIG. 2 is a block diagram of relevant parameters of an EGR system monitor algorithm according to an exemplary embodiment.

FIG. 2 shows the relevant parameters of an exemplary embodiment of an EGR SM 16 algorithm, which can be implemented in software and/or hardware. The algorithm generates as outputs one or more status indicators related to the performance of the EGR system. As shown in FIG. 2, the input parameters to the EGR SM 16 can include input signals 40, control factors 42, and noise factors 44. The EGR SM 16 determines outputs 46 related to whether EGR flow to the intake is sufficient and/or the EGR system response is slower than a nominal value, and perhaps other information related to the EGR system.

In an embodiment, the input signals 40 to the EGR SM 16 can include the engine's speed (rpm), total fueling (mg/stroke), the engine operating condition in the form of the engine speed-fueling points that determine the air-handling references, measured EGR flow rate $M_{EGR}$ (kg/min) (e.g., via delta-P measurement, $P_{egr}$, $T_{egr}$, IMP, IMT and FAF), air-handling references (kg/min) (e.g., commanded EGR flow ($M_{EGR}$_cmd), commanded charge air flow rate (MCF_cmd), and commanded fresh air flow rate ($M_{FAF}$_cmd), an enable flag that represents the fact that all prescribed enable conditions have been satisfied and the algorithm should start execution. Implementation of the algorithm for a particular engine application or platform can utilize different combinations and subsets of these inputs. The control factors 42 can include the digital filter cutoff frequency $\omega_{cutoff}$, filter design constraints, sampling frequency, run frequency, moving average filter bleed factor, and cumulative sum (cusum) threshold factor. The noise factors 44 can include air-handling sensor noise (e.g., noise related to sensors used for IMT, IMP, $P_{egr}$, $T_{egr}$ etc.), sensor functionality failure (e.g., sensors fail in-range, but respond slower), actuator wear/air-handling system aging, and component (e.g., sensor/actuator) faults.

Even though the algorithm is not intrusive in nature, it does not execute unless a minimum amount of EGR is flowing into the engine 10. The fact that an output response of the EGR SM 16 diagnoses low-flow means that a nominal amount of EGR needs to be flowing into the engine to detect lower than nominal flow. Also, both the low flow/slow response monitors are system level monitors which are affected by several of the air-handling sub-components, such as the sensors, actuators and cooler components of the air-handling system.

It is to be noted that in designing the algorithm to detect off-nominal EGR system behavior (i.e., low flow and slow response), that EGR mass flow $M_{EGR}$ is a variable that is being controlled by the air-handling control subsystem of the controller 15 that is well behaved, i.e., it is able to achieve the commanded flow in the specified amount of time. In other words, the air handling control system of the controller 15 has been tuned to have a certain specified closed-loop behavior e.g., bandwidth and steady-state error characteristics. Additionally, the controller is tuned to be robust to system variation from engine-to-engine and with time (aging characteristics) and has access to the reference signals, system responses, error signal and control signals. The robustness of the air handling subsystem makes the subsystem robust in the presence of faults of small magnitude.

With this in mind, the EGR SM 16 executes an algorithm designed to detect a deterioration of the close-loop control system performance as opposed to the detection of any parameter changes in the system behavior. During normal engine operation, the inability to meet the specified targets for EGR flow, charge flow or fresh air flow will skew the emissions recipe and will result in increased emissions out of the engine. The EGR SM 16 monitors and models the signal behavior and detects off-nominal system performance by correlating it with off-nominal signal behavior. More specifically, the EGR SM 16 monitors the closed-loop signals on-line to establish the closed-loop system parameters of the system and flag a fault when the system parameters, such as closed-loop bandwidth, the amount of time the controller operation is saturated etc., have reached threshold values.

Figure 3:
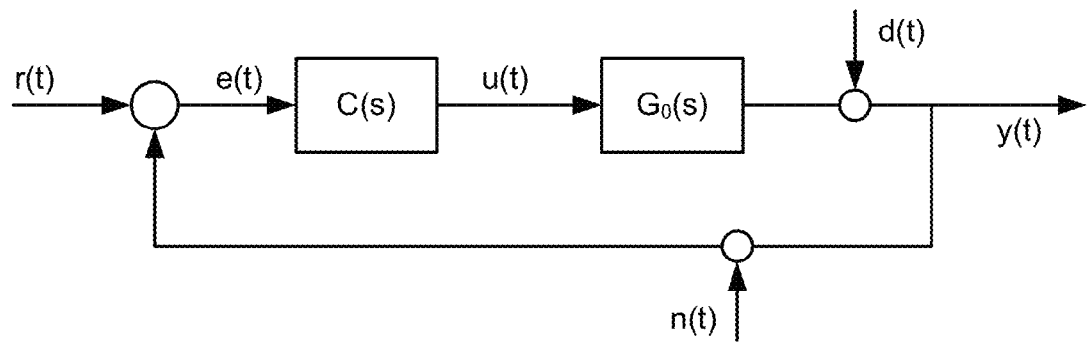
FIG. 3 is a block diagram of an exemplary closed-loop system with a plant.

FIG. 3 shows a block diagram of an exemplary closed-loop system with a plant whose nominal plant behavior is captured with the transfer function $G_0(s)$. This is shown in FIG. 3 with C(s) as the controller, and the overall modeling uncertainties in the plant behavior (e.g., nonlinearities, unknown parameters and neglected dynamics) are represented as $\Delta(s)$ (not shown). n(t) is typically attributed to the sensor noise factors, and forms one of the model uncertainties of the $\Delta(s)$ term. Hence, $\Delta(s)$ is a super-set of all the uncertainties in the system. r(t) is the reference that is being tracked, y(t) is the response, e(t) is the error (tracking error signal) that drives the controller with u(t) being the controller input to the plant.

Standard robust control system design methodologies seek to maximize the closed-loop performance subject to strict robustness requirements and include specifications for bandwidth (governing how fast the closed-loop system responds to changes in reference) and peak magnitude of the sensitivity function (how much of an impact do disturbances have on the system response). In a closed-loop control system, these specifications on the system behavior are captured via two transfer functions: T(s), which is the closed-loop transfer function that relates the response to the reference; and S(s), which quantifies the impact that disturbances have on the tracking error signal:

$$T(s) = \frac{Y(s)}{R(s)} = \frac{G_0(s)C(s)}{1+G_0(s)C(s)}, S(s) = \frac{-1}{1+G_0(s)C(s)}.$$

Hence, an ideal objective of the control system design is to design a controller C(s) such that within the bandwidth of the closed-loop system i.e., $\overline{\omega} \leq \omega_{BW}$, the response y(t) should follow the reference r(t) (i.e., T(s)=1) and disturbances (d(t)) and impact of the model uncertainty ($\Delta(s)$) are rejected i.e., (S(s)=0).

The likely faults or failure modes in an air-handling system which would lead to low-flow or slow-response in the EGR loop include, but are not necessarily limited to: restrictions and leaks in the EGR flow-path, faulty sensors, and slow-moving and/or failed actuators. All the failure modes identified for the EGR low-flow/slow-response impact the plant $G_0(s)$ and change the plant dynamics thereby changing the bandwidth $\overline{\omega}_{BW}$ of the closed-loop system. This in-turn increases the impact that the modeling uncertainty ($\Delta(s)$) and the disturbances (d(t)) have on the system response (y(t)) and change the spectral properties of the signal. In particular, the frequency components that were filtered in a healthy system would make an appearance in the failed system. The diagnostic algorithm for the monitoring of the EGR flow bases itself on this concept and tries to monitor the error signal (e(t)) in a particular frequency band to detect off-nominal behavior. In other words, faults show up in a closed-loop system in such a way that the tracking error signal is impacted and this impact manifests itself as a change in the frequency components. A filter can be designed that amplifies the section of the error tracking signal that contains the frequency components that have the major impact. In addition, the filter can also have the characteristics to attenuate the impact of other frequency components.

Figure 4:
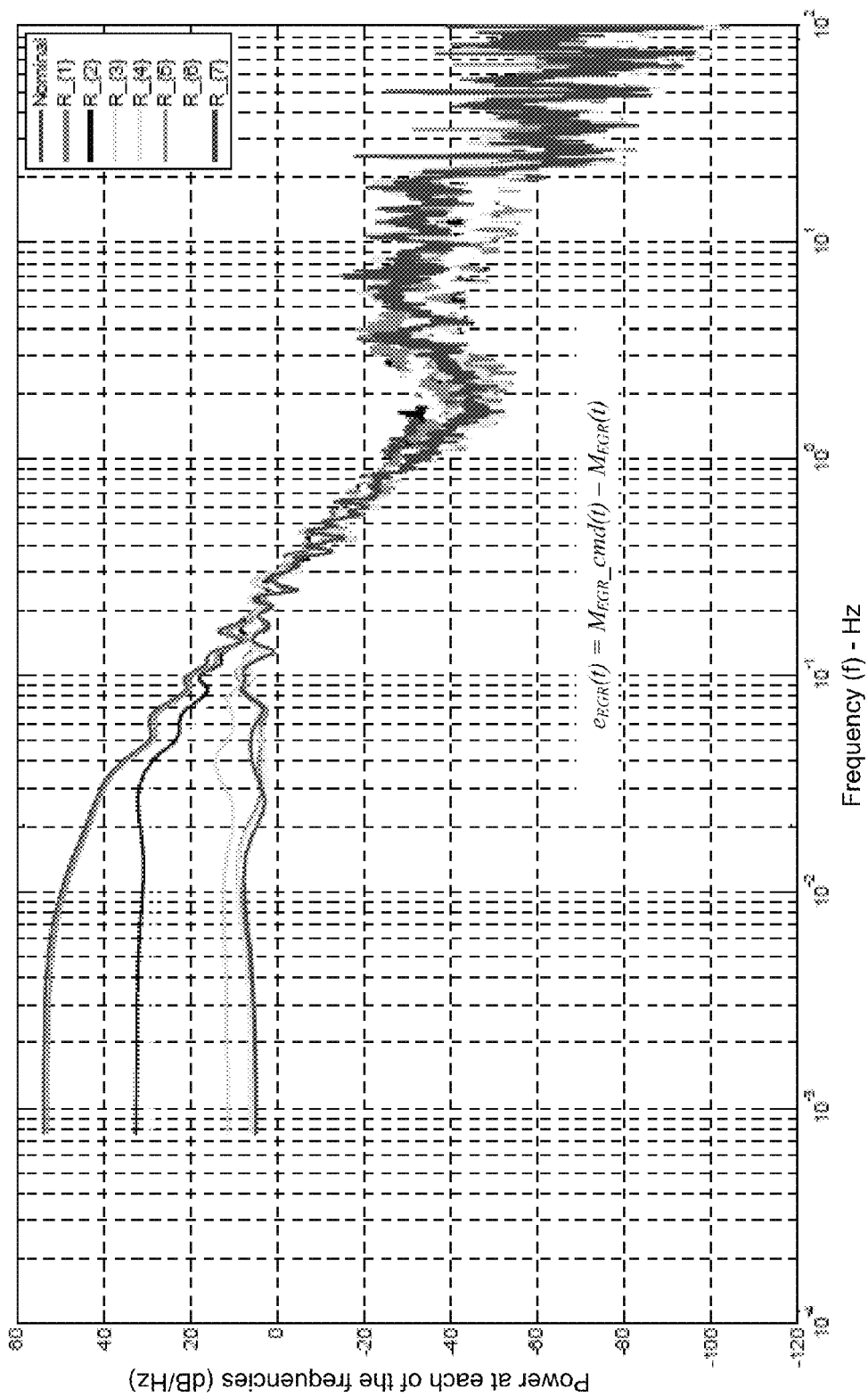
FIG. 4 is a graph of the power spectral density of an EGR flow tracking error for nominal and failed EGR systems.

The algorithm monitors the tracking error signal values between the commanded (reference) values of the various flow parameters (EGR flow/Fresh air flow/Charge flow) and the achieved (measured) values for these variables. The algorithm involves a filter, such as a low-pass filter or band pass filter, a moving average filter, and processing logic to detect off-nominal system behavior. It looks at a specific frequency spectrum and detects any deviation due to the lack of the ability of the control system to compensate for faults in the air-handling system. In a preferred embodiment, the algorithm detects off-nominal system behavior based on deviations in the EGR flow error, i.e., $e_{EGR}(t)=M_{EGR\_}cmd(t)-M_{EGR}(t)$, in the lower end of the frequency band. FIG. 4 shows the power spectral densities (PSD) for the EGR flow error in flow simulations in which a nominal (healthy) engine tuned to meet 0.5 g/bph-hr NOx with simulations of engines having restrictions (R_(1) to R_(7)) of various magnitudes placed upstream of the flow measurement device, here a delta-P sensor. As can be seen from FIG. 4, the power at the lower frequencies is impacted by the presence of restrictions, leading to lower EGR flow, and thus higher EGR flow error. From the analysis of this data, it is clear that the frequency content of the EGR flow error is affected by the presence of faults in the air-handling system, and that off-nominal system behavior (i.e., low EGR flow, slow EGR system response) can be detected by acquiring and monitoring the signals in a specific frequency band.

Figure 5:
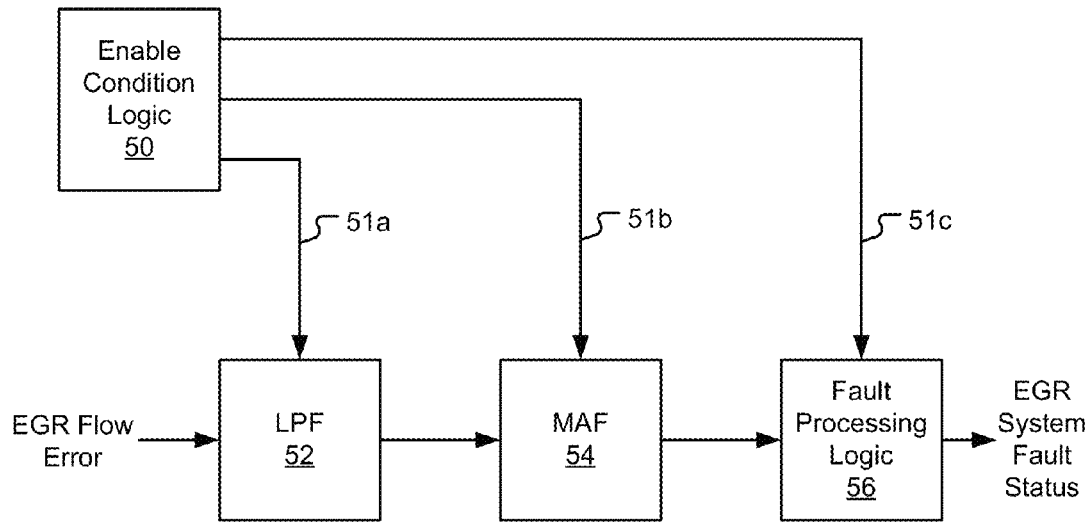
FIG. 5 is a diagram of an exemplary EGR system monitor modules and logic flow according to an exemplary embodiment.

FIG. 5 is a diagram of an exemplary EGR SM system and logic flow according to an exemplary embodiment. As shown in FIG. 5, an enable condition logic module 50 that manages the high-level operation of the algorithm including the execution of the other system components and algorithm execution entrance and exit. The various enable conditions (e.g., engine speed, total fueling, and air flow) are checked and if the conditions are met, the algorithm for the detection of the failure is triggered. If triggered, the enable condition logic module 50 provides enable signals along signal paths 51a-51c to the low pass filter 52, the moving average filter (MAF) 54 and the fault processing logic module 56.

The low pass filter (LPF) 52 receives an EGR flow error signal, which is the computed difference between the commanded reference and the actual EGR flow provided by the EGR closed-loop control system of the air-handling system. The computed error is then filtered through a filter (module LPF 52) whose characteristics have been designed to take into account the closed-loop bandwidth characteristics of the system being monitored. The LPF is designed such that it can monitor the closed-loop behavior of the system and detect changes in the closed-loop bandwidth of the system. For instance, the flow error can be filtered using an extremely high roll-off LPF to get at the low-frequency component of the flow error. In an embodiment, a high order LPF, such has a forth order analog or digital LPF can be used in the LPF 52.

Figure 6A:
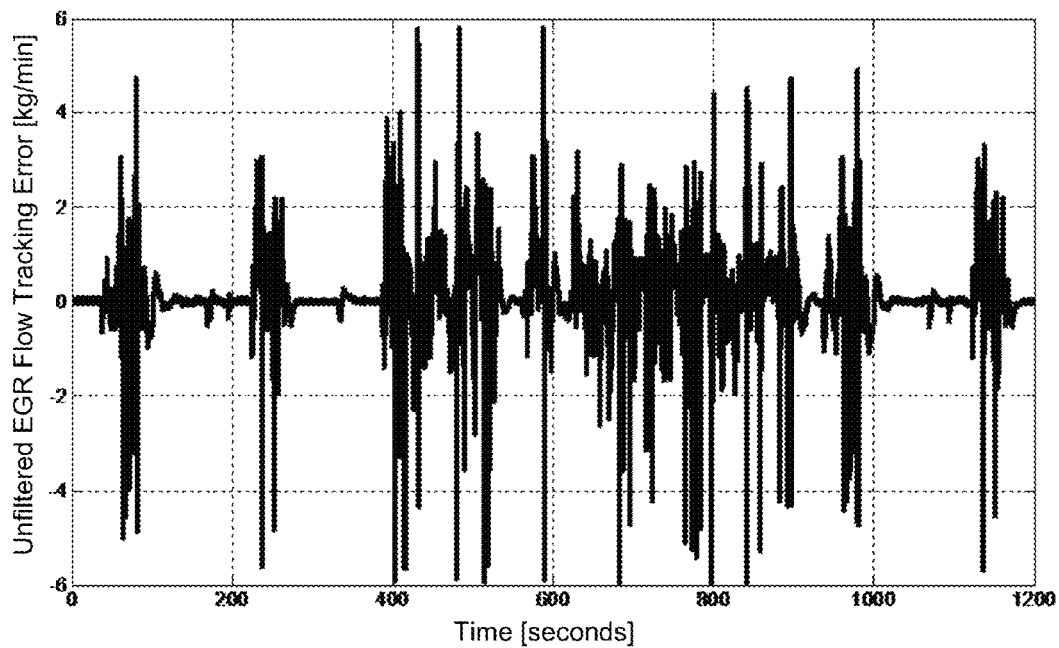
FIG. 6A is a graph showing an unfiltered EGR flow tracking error signal of a healthy engine during an FTP run.
Figure 6B:
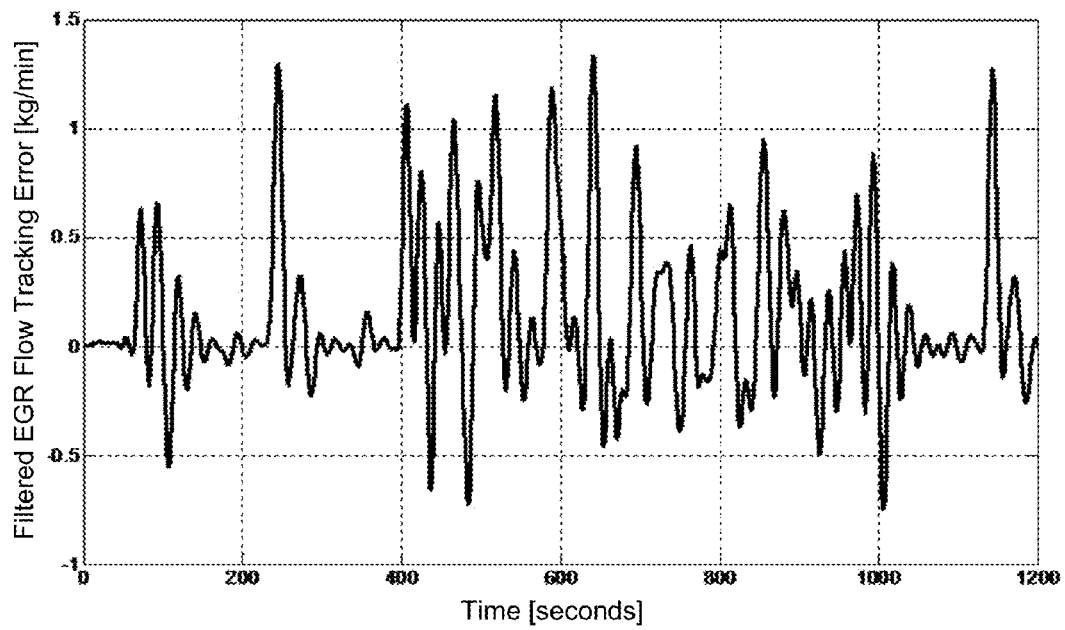
FIG. 6B is a graph showing a low pass filtered version of the EGR flow tracking error signal shown in FIG. 6A.
Figure 6C:
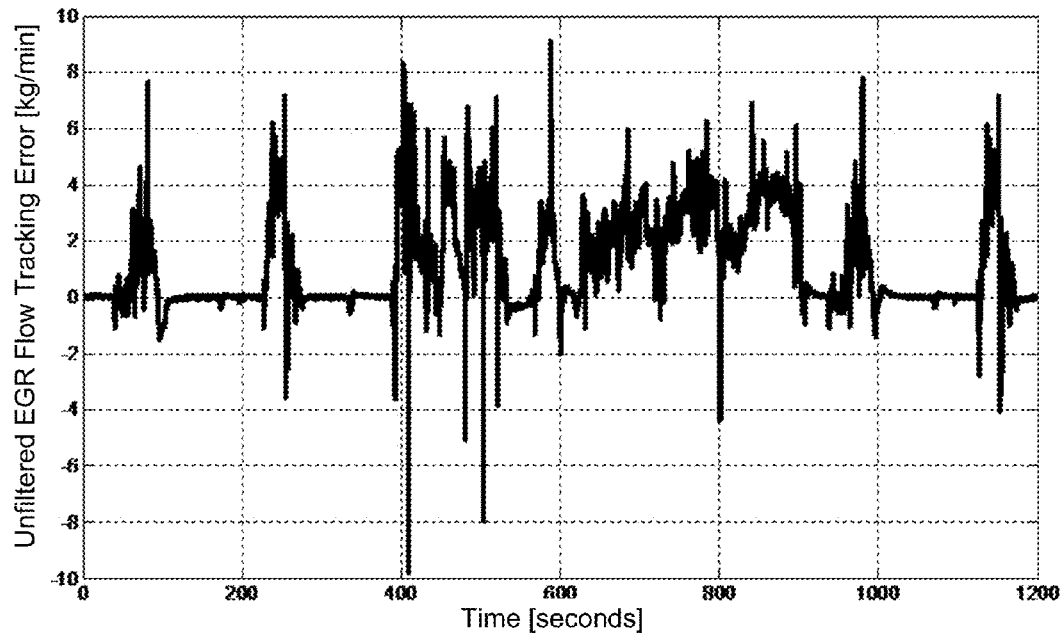
FIG. 6C is a graph showing an unfiltered EGR flow tracking error signal of a failed engine during an FTP run.
Figure 6D:
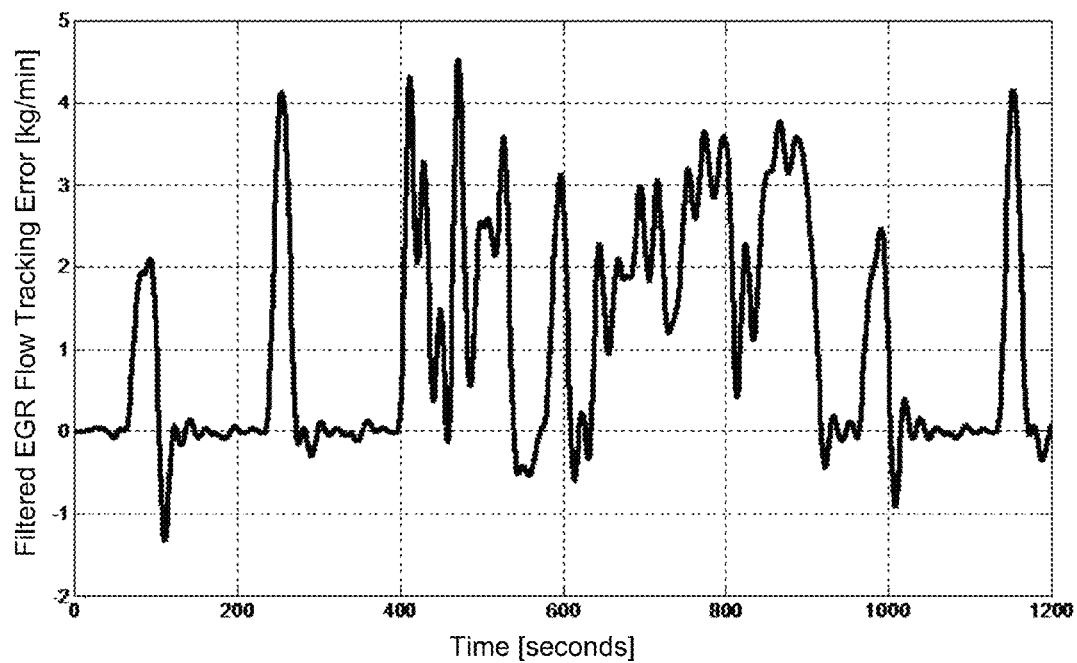
FIG. 6D is a graph showing a low pass filtered version of the EGR flow tracking error signal shown in FIG. 6C.

The LPF 52 enables monitoring the EGR flow error signal in a particular frequency region, here a low-frequency region, which allows for detection of the presence of a failure leading to low-flow/slow-response and off-nominal EGR system behavior. The LPF 52 preferably has the following properties: 1) a steep roll-off to obtain the error signal without any distortion due to the impact of undesirable frequency components, 2) a cut-off frequency at the very low frequencies (e.g., approx 0.01 Hz range), 3) a minimal number of parameters to tune for the filter, and 4) minimal phase distortion (helpful to use a linear phase design). In an embodiment, the LPF 52 can be designed and implemented as an infinite impulse response (IIR) based low-pass digital filter. For a given cut-off frequency, an IIR based digital LPF provides a filter with less number of parameters in its implementation and requires less memory and has lower computational complexity In an embodiment, the LPF 52 is a digital low-pass filter based on the Chebyshev Type I filter with filter order of four. The filter runs at a rate of ($F_s$) 50 Hz (0.02 ms) with a pass-band frequency of 0.05 Hz ($F_{pass}$) and stop-band frequency of 0.5 Hz ($F_{stop}$). The Chebyshev Type I filter is an all-pole filter which has equiripple behavior in the pass-band. Experimental runs of FTP (federal test procedure) runs were performed for healthy engine and the unhealthy (failed) engine having a restriction before the delta-P sensor of the EGR loop. The unfiltered EGR flow error for the healthy engine is shown in FIG. 6A and the filtered EGR flow error for the healthy engine is shown in FIG. 6B. The unfiltered EGR flow error for the failed engine is shown in FIG. 6C and the filtered EGR flow error for the failed engine is shown in FIG. 6D. As can be seen, the transient jumps in the unfiltered signal which might lead to false alarms have been filtered out to get at the low-frequency part of the EGR flow error.

Next, the filtered EGR flow error signal is provided to the MAF 54, which accumulates the filtered error signal over a moving time window. The MAF 54 is used to avoid setting faults based on brief excursions outside the normal range of EGR flow error. This ensures that a fault is not set until an accumulated error is greater than a prescribed threshold. Also, a bleed-off factor can be used to reduce the accumulated error to account for transients where an error signal can jump to a high value even in the absence of a fault. The bleed-off factor can be calibrated to avoid a false-alarm (i.e., an erroneous fault/fail status). The window for the MAF 54 is such that it covers enough of time range to account for transients without being overly cumbersome in terms of the memory impact because this data is stored (e.g., in the ECU/ECM).

In an embodiment, the MAF 54 is a cusum filter or a cumulative error accumulation algorithm that computes the cumulative filtered error at time-step k, $e_{cusum}^f(k)$ as:

$$e_{cusum}^f(k)=\text{Max}(0, e_{cusum}^f(k-1)+e^f(k)-K))$$

where, $e^f(k)$ is the filtered EGR flow error at time-step k and K is a bleed off factor that is used to ensure false alarms do not occur as a result of jumps in the flow error from transient events. In every process, there are two types of events that impact the error: transient jumps due to a special cause whose impact is temporary and causes that persist for a while and impact the error all the time. The cusum/moving average filter helps detect persistent changes. See, D. M. Hawkins and D. H. Olwell. *Cumulative sum charts and charting for quality improvement*, Springer-Verlag, Berlin, 1997. The MAF module 54 (e.g., cusum/moving average filter) is a linear filter that enables detection of persistent faults that occur in the EGR flow process. The MAF module 54 can include filtering of the signal to remove influence of signal/sensor noise and process noise and improves the reliability of the algorithm by reducing the number of false alarms due to transient events.

Figure 7A:
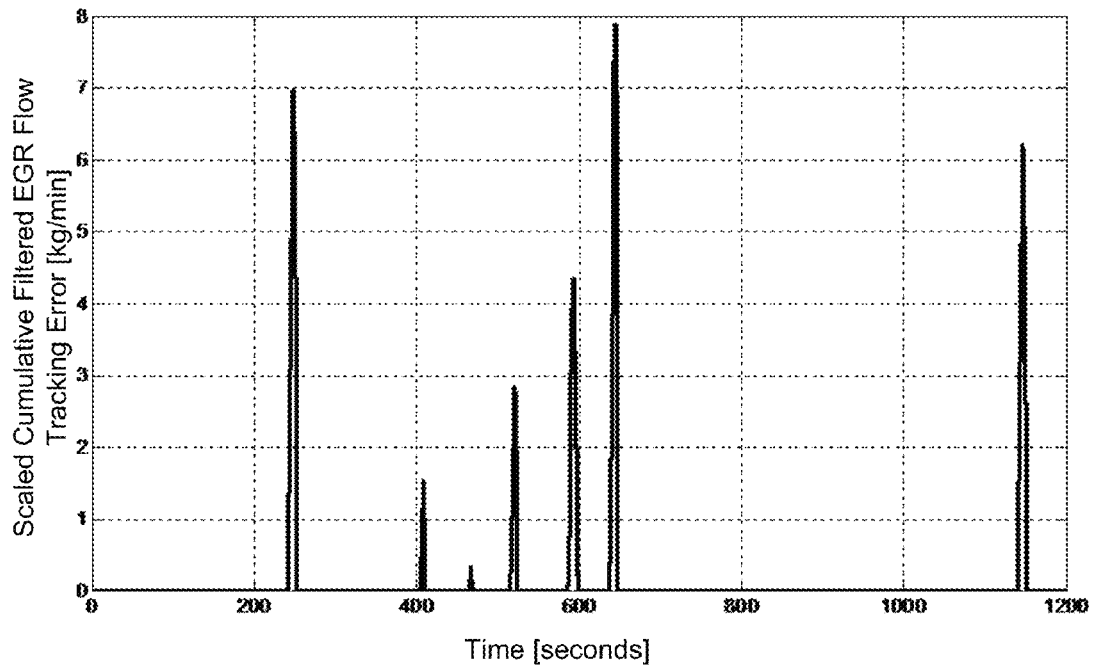
FIG. 7A is a graph of scaled cumulative filtered EGR flow error of the flow tracking error shown in FIG. 6B.
Figure 7B:
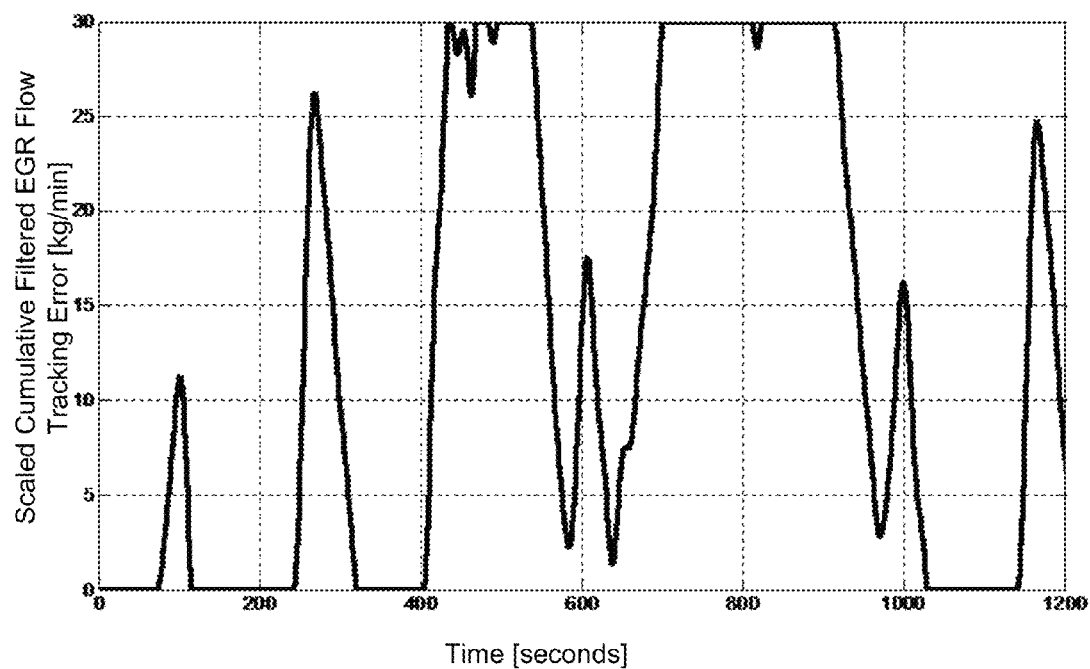
FIG. 7B is a graph of scaled cumulative filtered EGR flow error of the flow tracking error shown in FIG. 6D.

Output signals from the MAF module 54 for the healthy engine and the failed engine examples of FIGS. 6A to 6D are plotted in FIGS. 7A and 7B, respectively. As can be seen, the separation between the nominal engine behavior and failed system behavior is of sufficient magnitude such that reliable detection of a failed EGR flow system is achievable.

The accumulated error determined by the MAF module 54 is provided as input to a fault processing logic module 56, which decides a no-fault/fault (pass/fail) status of the EGR system. The pass/fail decision regarding the EGR system health is made based on the EGR flow reference signal, the cusum of the filtered EGR flow error, the EGR valve position, and mean fueling during the period of observation.

The fault processing logic module 56 monitors the accumulated EGR flow error and a fault is set if this value is greater than a prescribed threshold. For additional robustness, the cusum filter can be reset every set number of seconds. Additionally, monitoring the flow reference signal and the EGR valve position can ensure operation is within a region of interest (e.g., inputs to the diagnostic enable logic, which can be run when the EGR flow reference value and the EGR valve position are greater than a specified threshold). The thresholds for fault detection can be a calibrated value based on the different emission levels that need to be met by the different platforms. In other words, emission levels can drive the requirements on the EGR system performance and hence, drive the requirements on the EGR tracking error behavior.

Figures 8A, 8B:
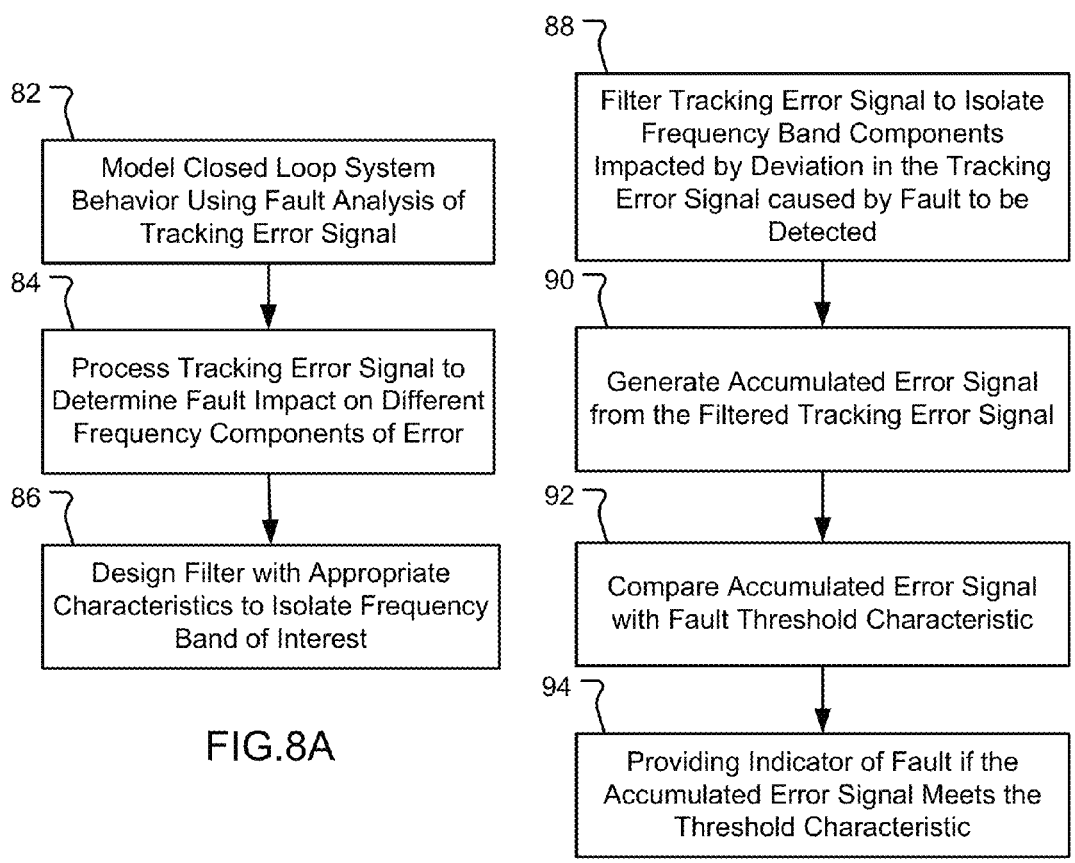
FIG. 8A is a flow chart of a method of modeling response of a closed-loop system to a fault according to an exemplary embodiment.
FIG. 8B is a flow chart of a method of detecting a fault in a closed-loop system according to an exemplary embodiment.

FIG. 8A shows an exemplary process flow of for modeling a closed-loop system under fault condition and design of a filter for extracting the frequencies of interest. The process begins at process 82 with analyzing a tracking error signal of a closed-loop system while under a fault condition. For example, a fault common to the closed-loop system can be modeled or simulated to gather data on tracking error signal's power spectral density. Using these data, the tracking error signal response is analyzed in process 84 to determine fault impact on different frequency components of error. Next, in process 86, a frequency band of interest that was determined in process 84 can be used in the design of a filter with appropriate characteristics (e.g., roll-off/phase impact/band-width of the closed-loop system) to isolate that frequency band of interest.

FIG. 8B shows an exemplary process flow of a method for determining fault in a closed-loop system. Starting with process 88, a tracking error signal of a closed-loop system is filtered to isolate frequency components that would be impacted by deviation in the tracking error signal caused by fault to be detected. The type and characteristics of the filter correspond to the nature of the closed-loop system and its fault response characteristics.

Next, process 90 generates an accumulated error signal from the filtered tracking error signal. For example, a moving average filter/mechanism or other summing algorithm (e.g., cusum moving average filter) can be used to cumulatively accumulate error. In process 92, the accumulated error signal is compared with a predetermined stored fault threshold characteristic. If the accumulated error signal (e.g., a signal characteristic or value) meets the predetermined fault threshold characteristic (e.g., shape, trend, duration and/or value), such as a predetermined stored value, an indicator of a fault in the closed-loop system is provided in process 94. For example, the fault can be provided on a display of a diagnostic/warning screen, downloaded during an OBD event, and/or stored in the system memory for later retrieval. In some embodiments, an indication/determination of a fault or failure can cause an automatic initiation of an event, such as sending a message, shutting down the plant or system, or causing compensation adjustment(s) to occur.

While the exemplary embodiments are sometimes described in the context of an EGR system of internal combustion engine, it is to be understood that the same concepts can be applied to any controlled and tracked variable. Other examples could include monitoring of the fresh air-flow system using the measurement of the fresh air-flow using a MAF sensor and the commanded reference as a function of the engine operating condition. Similarly, a fuel system can utilize the reference value of the rail pressure and the feedback from the rail-pressure sensor, and thus the fuel system also benefit from monitoring the performance of a closed-loop variable, as disclosed herein, to detect faults in the fueling system. The concepts disclosed herein can be used for any tracked closed-loop systems variable that can be modeled, and for which a filters can be designed to isolate interested frequencies and error accumulated.

Further, while embodiments described herein utilize a low pass filter to acquire flow error data in a low-frequency region, it should be appreciated that another type of filter may be utilized, such as a band pass filter, to limit/isolate the frequency to a particular range or band. Additionally, an embodiment can be implemented without a filter that filters the tracking error signal to isolate a band of frequency components impacted by deviation in the error signal caused by a fault to be detected. In such embodiments, omission of the filter reduces fault detection performance, but the tracking error signal can be accumulated using a cumulative filter (MAF) or other accumulation algorithm to provide a level of fault detection in a controlled system.

Embodiments consistent with the invention can provide accurate and robust and fault detection of closed-loop systems, on-line, and with minimal processing and memory expenditure.

Although a limited number of embodiments is described herein, one of ordinary skill in the art will readily recognize that there could be variations to any of these embodiments and those variations would be within the scope of the appended claims. Thus, it will be apparent to those skilled in the art that various changes and modifications can be made to the system, method and apparatus for monitoring closed-loop system described herein without departing from the scope of the appended claims and their equivalents.

What is claimed is:

1. A method of detecting fault in a closed-loop system, comprising:
    monitoring a tracking error signal indicative of a difference between a reference value of a variable of the closed-loop system to be controlled and a measured value of the variable being controlled;
    filtering the tracking error signal to isolate a band of frequency components impacted by deviation in the tracking error signal caused by a fault to be detected, said isolated band being a subband having less frequency components than a band of frequency components corresponding to the tracking error signal, the subband present in a bandwidth of a tracking error signal of a corresponding predetermined nominal version of the closed-loop system, and the subband having a cutoff frequency toward a lower end of the band of frequency components corresponding to the tracking error signal;
    generating an accumulated error signal from the filtered tracking error signal;
    comparing, using a processor, the accumulated error signal with a predetermined fault threshold characteristic, said comparison based on a difference between spectral power of the subband of the filtered tracking error signal and spectral power of the subband present in the bandwidth of the tracking error signal of the corresponding predetermined nominal version of the closed-loop system; and
    providing an indicator of fault in the closed-loop system if the accumulated error signal meets the predetermined threshold.

2. The method according to claim 1, further comprising determining whether an enable condition has been satisfied before allowing the filtering, generating, comparing and providing steps to commence.

3. The method according to claim 1, wherein generating an accumulated error signal includes providing the filtered tracking error signal to a moving average filter.

4. The method according to claim 3, wherein the moving average filter is a cusum filter.

5. The method according to claim 1, wherein the step of filtering the tracking error signal comprises providing the tracking error signal to a low pass filter having a stop-band frequency less than about 0.5 Hz.

6. The method according to claim 1, wherein the step of generating an accumulated error signal includes adjusting the accumulated error using a bleed-off factor.

7. The method according to claim 1, wherein the closed-loop control system is part of an internal combustion engine system.

8. The method according to claim 7, wherein the closed-loop system is at least one of an air-handling system that controls and regulates an amount of fresh air-flow and EGR flow sent into a cylinder, a fuel system that controls a timing of fuel injection and an amount of fuel that is injected into the cylinder, and a control system of an exhaust aftertreatment system of the internal combustion engine system.

9. The method according to claim 7, wherein the indicator of fault is provided as output from an on-board diagnostic (OBD) system of the internal combustion engine system.

10. A system for monitoring a tracking error signal indicative of a difference between a reference value of a variable of a closed-loop system to be controlled and a measured value of the variable being controlled and detecting faults in the closed-loop system, comprising:
a first filter module adapted to receive the tracking error signal and filter the tracking error signal to isolate a band of frequency components impacted by deviation in the tracking error signal caused by a fault to be detected, said isolated band being a subband having less frequency components than a band of frequency components corresponding to the tracking error signal, the subband present in a bandwidth of a tracking error signal of a corresponding predetermined nominal version of the closed-loop system, and the subband having a cutoff frequency toward a lower end of the band of frequency components corresponding to the tracking error signal;
a second filter module communicatively coupled with the first filter module and adapted to receive the filtered tracking error signal and generate an accumulated error signal from the filtered tracking error signal; and
a fault processing module communicatively coupled with the second filter module and adapted to receive the accumulated error signal and compare the accumulated error signal with a stored predetermined fault threshold characteristic and provide an indication of fault in the closed-loop system if the accumulated error signal meets the predetermined fault threshold characteristic, said comparison based on a difference between spectral power of the subband of the filtered tracking error signal and spectral power of the subband present in the bandwidth of the tracking error signal of the corresponding predetermined nominal version of the closed-loop system.

11. The system according to claim 10, further comprising an enable condition module adapted to determine whether an enable condition has been satisfied before allowing the filtering, generating, comparing and providing steps to commence.

12. The system according to claim 10, wherein the second filter module is a moving average filter.

13. The system according to claim 12, wherein the moving average filter is a cusum filter.

14. The system according to claim 10, wherein the first filter module is a low pass filter having a stop-band frequency less than about 0.5 Hz.

15. The system according to claim 10, wherein generating an accumulated error signal includes adjusting the accumulated error using a bleed-off factor.

16. The system according to claim 10, wherein the closed-loop control system is part of an internal combustion engine system.

17. The system according to claim 16, wherein the closed-loop system is at least one of an air-handling system that controls and regulates an amount of fresh air-flow and EGR flow sent into a cylinder, a fuel system that controls a timing of fuel injection and an amount of fuel that is injected into the cylinder, and a control system of an exhaust aftertreatment system of the internal combustion engine system.

18. The system according to claim 16, wherein the indication of fault is provided to as output of an on-board diagnostic (OBD) system of the internal combustion engine system.

19. An internal combustion engine system, comprising:
an engine;
an intake manifold connected to the engine;
an intake body fluidly connected to the intake manifold, said intake body including a chamber through which charge air flows;
an exhaust manifold connected to the engine;
an exhaust gas recirculation (EGR) passage fluidly connected at one end thereof to the exhaust manifold and at another end thereof to the chamber of the intake body, wherein exhaust gas flow through said EGR passage is controlled by an EGR closed-loop system as a function of an exhaust flow tracking error signal; and
a monitor for detecting faults in the EGR closed-loop system, said monitor including:
a first filter element that receives the exhaust tracking error signal and filters the tracking error signal to isolate a band of frequency components impacted by deviation in the error signal caused by a fault to be detected and provide a filtered tracking error signal having the isolated frequency band, said isolated band being a subband having less frequency components than a band of frequency components corresponding to the tracking error signal, the subband present in a bandwidth of a tracking error signal of a corresponding predetermined nominal version of the closed-loop system, and the subband having a cutoff frequency toward a lower end of the band of frequency components corresponding to the tracking error signal;
a second filter element communicatively coupled with the first filter element and adapted to receive the filtered tracking error signal and generate an accumulated error signal from the filtered tracking error signal; and
a fault processing element communicatively coupled with the first filtering module and adapted to receive the accumulated error signal, compare the accumulated error signal with a stored predetermined fault threshold characteristic, and provide an indicator of fault in the closed-loop system if the accumulated error signal meets the predetermined threshold, said comparison based on a difference between spectral power of the subband of the filtered tracking error signal and spectral power of the subband present in the bandwidth of the tracking error signal of the corresponding predetermined nominal version of the closed-loop system.

20. The internal combustion engine system of claim 19, wherein the monitor is part of an on board diagnostic system of the internal combustion engine system.

* * * * *